(12) United States Patent
Ebersberger et al.

(10) Patent No.: US 8,730,672 B2
(45) Date of Patent: May 20, 2014

(54) POWER SEMICONDUCTOR SYSTEM

(75) Inventors: Frank Ebersberger, Altdorf (DE); Peter Beckedahl, Oberasbach (DE); Hartmut Kulas, Ebermannstadt (DE)

(73) Assignee: Semikron Elektronik GmbH & Co., KG, Nürnberg (DE)

( * ) Notice: Subject to any disclaimer, the term of this patent is extended or adjusted under 35 U.S.C. 154(b) by 243 days.

(21) Appl. No.: 13/290,123

(22) Filed: Nov. 6, 2011

(65) Prior Publication Data

US 2013/0114210 A1    May 9, 2013

(30) Foreign Application Priority Data

Nov. 5, 2010    (DE) .......................... 10 2010 043 446

(51) Int. Cl.
*H05K 7/20*    (2006.01)
(52) U.S. Cl.
USPC ........... 361/699; 361/677; 361/689; 361/702; 361/707; 361/831; 361/712; 361/714; 361/721; 363/141; 174/15.1; 174/16.3; 174/526; 174/548
(58) Field of Classification Search
USPC ........................ 361/676–678, 679.46–679.54, 361/688–693, 698–704, 707, 715–716, 722, 361/763, 831
See application file for complete search history.

(56) References Cited

U.S. PATENT DOCUMENTS

| | | | | |
|---|---|---|---|---|
| 6,434,003 | B1 * | 8/2002 | Roy et al. | 361/699 |
| 7,839,641 | B2 * | 11/2010 | Baba et al. | 361/711 |
| 8,081,465 | B2 * | 12/2011 | Nishiura | 361/703 |
| 8,467,188 | B2 * | 6/2013 | Hsieh et al. | 361/698 |
| 8,488,315 | B2 * | 7/2013 | Herron et al. | 361/689 |
| 2003/0133267 | A1 * | 7/2003 | Beihoff et al. | 361/704 |
| 2008/0130233 | A1 | 6/2008 | Jin | |
| 2008/0237847 | A1 * | 10/2008 | Nakanishi et al. | 257/722 |
| 2009/0107655 | A1 * | 4/2009 | Kajiura | 165/80.3 |
| 2010/0053889 | A1 * | 3/2010 | Miller et al. | 361/689 |
| 2010/0208427 | A1 * | 8/2010 | Horiuchi et al. | 361/699 |

FOREIGN PATENT DOCUMENTS

| | | |
|---|---|---|
| DE | 10 2005 037 522 | 9/2005 |
| DE | 10 2008 016 960 A1 | 10/2008 |

* cited by examiner

*Primary Examiner* — Courtney Smith
(74) *Attorney, Agent, or Firm* — The Law Offices of Roger S. Thompson (57) ABSTRACT

A power semiconductor system and method for producing a power semiconductor system. In one embodiment, the application relates to a power semiconductor system, comprising a line system for a fluid working medium; wall element having an outer side and an inner side; and a power semiconductor circuit arranged at the outer side of the wall element, wherein the inner side of the wall element forms a fluid-tight wall of the line system.

11 Claims, 5 Drawing Sheets

POWER SEMICONDUCTOR SYSTEM

BACKGROUND OF THE INVENTION

1. Field of the Invention

The present invention is directed to a power semiconductor system using known power semiconductor modules.

2. Description of the Related Art

Many types of power semiconductor modules are known. In one typical embodiment, a substrate with a power semiconductor circuit and a base body are assembled to form a power semiconductor module. In this case, care should be taken to ensure that the heat transfer between the power semiconductor circuit, base body and a heat sink arranged with respect thereto is ensured to provide the desired dissipation of waste heat from the power semiconductor circuit, and that simple, preferably automated, mounting of the power semiconductor module is possible.

By way of example, German Published Patent Application No. DE 10 2005 037 522 describes a power semiconductor module for mounting on a heat sink, wherein the power semiconductor module has a metallic base body, which forms a trough and encloses on five sides a substrate that is arranged therein and carries a power semiconductor circuit. The base body preferably consists of copper owing to its outstanding thermal conductivity. The base body can be connected to a heat sink directly, for example by means of an adhesive-bonding or screw connection.

What is disadvantageous about such a power semiconductor module is the sub-optimal heat transfer from the power semiconductor circuit to the heat sink, which is caused by the connection between base plate and heat sink.

It would be desirable, therefore, to provide a power semiconductor module with improved heat transfer.

OBJECTS AND SUMMARY OF THE INVENTION

Against this background, the invention is based on the object of presenting an improved power semiconductor system in which efficient heat transfer from the power semiconductor circuit to a cooling medium is possible.

The present disclosure proposes, inter alia, arranging a power semiconductor circuit at an outer wall of a wall element, the inner wall of which forms a liquid- and/or gas-tight wall of a line system that is provided for cooling the semiconductor circuit and carries a fluid working medium. Outstanding cooling of the power semiconductor circuit is thereby achieved.

The inventive power semiconductor system has a line system for a fluid working medium—for example a cooling liquid or a cooling gas. The line system can be a closed line system or form a line system that is closed except for an inlet opening and an outlet opening. This prevents the working medium from escaping in an undesirable manner. The inlet and outlet openings can be arranged on the same side, preferably an end side of the metal shaped body. The inlet and outlet openings can connect the line system to a pump system to pump the working medium through the line system. In this case, the line system and the pump system together form a closed line system. Circulation of the working medium within the line system for dissipating heat can be effected both passively on the basis of the heating of the working medium—for example in the form of a thermosiphon or a so-called heat pipe—and actively—such as by means of a pump system as described above. The working medium can be chosen freely. The working medium can be gaseous or liquid under normal conditions. Suitable working media are known to the person skilled in the art of thermosiphons and heat pipes, and may include, inter alia, water, oil, ethanol, acetone and ammonia or mixtures thereof. During heat transport within the line system, the working medium can change between a liquid and a gaseous state.

The power semiconductor system has a wall element having an outer side and an inner side. The outer side can be understood as a side of the wall element that substantially faces away from the line system, and the inner side can be understood as a side of the wall element that substantially faces the line system. In this case, the inner side and the outer side of the wall element can form the main areas of the wall element. The inner and outer sides can be formed—in each case individually—in planar or structured fashion. By way of example, the top side can have at least one structure element for fixing a power semiconductor circuit.

The wall element can be plate-shaped, or substantially plate-shaped, or have at least one substantially plate-shaped section forming an essential element of the wall element. In this case, "essential" should be understood to mean that the described functionality of the wall element—if this functionality is not optional for the respective embodiment of the wall element—is at least partly ensured by the element or the section. In the case of a substantially plate-shaped wall element, a distance between inner and outer sides of the wall element is small in relation to the length of the wall element, for example less than 10% or less than 5% of the length of the wall element. Similarly, in the region of the plate-shaped section, a distance between inner and outer sides of the wall element is small in relation to the length of the plate-shaped section, for example less than 10% or less than 5% of the length of the plate-shaped section. This at least partly small distance results in a good thermal conductivity between inner and outer sides. Furthermore, the plate-shaped form results in a good ratio between heat transfer area and distance between inner and outer sides and also requires only limited use of material.

The inventive power semiconductor system has a power semiconductor circuit arranged at the outer side of the wall element. Given a suitable choice of the form and/or the size of the wall element, simple and/or automated and/or secure mounting of the power semiconductor circuit at the outer side of the wall element can be fostered. Moreover, the wall element can impart to the power semiconductor circuit a stability that protects the power semiconductor circuit during later assembly of the wall element with the line system. This is particularly beneficial when a power semiconductor circuit is intended to be replaced after the power semiconductor circuit has been started up, i.e., at the site of use.

The inventive power semiconductor circuit can be a circuit comprising at least one semiconductor component having a rated voltage of greater than 100 V or even greater than 600 V. The inventive power semiconductor circuit can also be a circuit which may be used to switch a current path between a first potential and a second potential in response to at least one control signal, selectively between a substantially closed (low-impedance) state and a substantially open (high-impedance) state, wherein a difference between the first potential and the second potential is more than 100 V or even more than 600 V, or wherein a current flowing in the closed state regularly via the current path is more than 100 A or even more than 1000 A.

In accordance with the invention, the inner side of the wall element forms a fluid-tight wall of the line system. What can be achieved in this way is that the power semiconductor circuit is arranged very close to a fluid working medium provided in the line system, as a result of which the heat transfer between the power semiconductor circuit and the fluid working medium and, consequently, also the dissipation of the waste heat arising in the power semiconductor circuit are fostered. The fact of whether the inner side of the wall element is intended to form a gas-tight wall of the line system or only a liquid-tight wall of the line system is dependent on the working medium used and on the operating circumstances to be expected. If it is to be expected that the working medium can assume a gaseous state, the inner side of the wall element should be gas-tight.

The power semiconductor system can have a metal shaped body—for example a metal shaped body produced wholly or partly from copper and/or aluminium—which is a structure that is separate or can be separated from the wall element. In this case, it is preferred if the metal shaped body and the wall element are formed from the same material, preferably aluminium. The wall element can be fixed to the metal shaped body in a force-locking and/or positively locking manner. In this case, known screw connections, snap-action latching connections or else connections which are formed by the deformation of a section of the wall element and/or of the metal shaped body are preferred. Due to its generally good thermal conductivity, metal is a suitable material for conducting away waste heat which was transported for example on account of a temperature gradient from a power semiconductor circuit to the metal shaped body. The metal shaped body can be formed as a heat sink, for example as a ribbed heat sink.

The line system can be arranged in and/or on the metal shaped body. Such a metal shaped body is often—independently of whether the working medium is liquid or gaseous—designated as a liquid-cooled heat sink and is able to dissipate large amounts of waste heat from the metal shaped body, since the working medium serves as a heat transport means. In particular, a part of the line system can be formed by cavities in the metal shaped body—for example by holes. This fosters transfer of heat from the metal shaped body to the working medium. The metal shaped body can also have a depression in which a capacitor is arranged, and which is electrically insulated from the metal shaped body by a potting material. In this way, the metal shaped body can serve as a heat sink and/or as a carrier for various power semiconductor components.

In another embodiment, the metal shaped body can have a first cavity which forms a part of the line system and which has an opening at at least one surface of the metal shaped body. The wall element can be mounted on the metal shaped body in such a way that the inner side of the wall element closes off the opening in a liquid- and/or gas-tight manner. Such a cavity can be produced simply, for example by using a corresponding casting mold for producing the metal shaped body or by drilling or milling a metal shaped body. The opening can be closed off equally simply on the basis of the fluid-tightness of the inner side of the wall element. By way of example, the inner side of the wall element can completely cover the opening and seal the opening towards the outside by direct contact with the metal shaped body along the entire circumference of the opening, preferably by means of an elastic sealing element, in a liquid- and/or gas-tight manner. In this case, the wall element can bear on an outer area of the metal shaped body or produce within the opening—for example along a web provided at the inner circumference of the opening—a fluid-tight connection to the metal shaped body. Consequently, the opening—together with other cavities provided in the metal shaped body—forms a part of the line system. A working medium that flows into the first cavity can come into direct contact with the inner side of the wall element.

The power semiconductor system can have an elastic sealing element—for example an O-ring. The sealing element—which can also be formed from many individual sealing elements—can interact with the wall element—for example with the inner side of the wall element—in order to close off an opening as described above at at least one surface of the metal shaped body in a liquid- and/or gas-tight manner. By way of example, the wall element can be fixed to the metal shaped body and the sealing element can be clamped between the wall element and the metal shaped body and be arranged around the opening in known fashion so that the opening is closed off in a liquid- and/or gas-tight manner. By way of example, the sealing element may be arranged in the region of an inner circumference of the opening. The sealing element can run adjacent to a circumference of the opening—for example along a web provided at the inner circumference of the opening—around the opening. In this case, the sealing element can be situated within or outside the opening. The use of an elastic sealing element can reduce the risk of damage to the power semiconductor circuit during the mounting of the wall element on the metal shaped body, since a comparatively lower force has to be exerted on the wall element to ensure the tightness.

The abovementioned first cavity in the metal shaped body can have a first opening, which is connected to an inlet-side section of the line system, and/or a second opening, which is connected to an outlet-side section of the line system. In this way, it is possible to ensure that the working medium flows through the first cavity at least between the first and second openings. For this reason, the cavity can have an elongate form wherein the first opening is situated in an outermost third and the second opening in an outermost third—opposite to the first opening—of the length of the cavity. The first and second openings can in each case extend over more than 60% or more than 80% of the width of the cavity. This ensures a flow of the working medium through a large part of the cavity. The inlet-side and/or the outlet-side section of the line system can be formed in each case by an individual hole. By way of example, the inlet-side and/or the outlet-side section of the line system can be formed by a hole in the metal shaped body which runs transverse to the length of the first cavity. The first and/or second opening can consequently be produced by milling the cavity as far as the hole into an area of the metal shaped body. At the interface between the cavity and the hole, the first and/or second hole arises without further assistance. A plurality of cavities can be shaped parallel to one another in the metal shaped body in such a way that the cavities are respectively offset relative to one another only with regard to their longitudinal axes. In this way, an individual hole can function as inlet- and/or outlet-side section of the line system for all of the cavities.

The metal shaped body can have an inlet opening and an outlet opening. The line system can extend in a fluid-tight manner between the inlet opening and the outlet opening. For good linking to a further line system—for example to the line system of a pump system—it is helpful if the metal shaped body has a defined inlet opening and a defined outlet opening. By way of example, the metal shaped body can have merely an individual inlet opening and/or merely an individual outlet opening. As a result, it also becomes simpler to ensure the fluid-tightness of the line system. The fact of whether the line system is intended to extend in a gas-tight manner or merely in a liquid-tight manner between the inlet opening and the outlet opening is dependent on the working medium used and on the operating circumstances to be expected. If it is to be expected that the working medium can assume a gaseous state, the line system should be gas-tight.

The power semiconductor system can have a frame fixed to the metal shaped body. The frame can fix the wall element to the metal shaped body in a force-locking and/or positively locking manner. By way of example, the frame can press the wall element against the metal shaped body. The use of a frame permits the simultaneous exertion of force on different locations of the wall element. As a result, it is possible to reduce the probability of a harmful mechanical deformation of the power semiconductor circuit arranged at the wall element. The frame can be composed of an electrically insulating material—for example composed of plastic. The frame can also be—at least for the most part—composed of an electrically conductive material—for example metal—which is electrically insulated from the current-carrying elements of the power semiconductor circuit by means of an electrically insulating material. The frame can be formed such that the frame bears on the wall element only in an outer edge region of the outer side of the wall element. The frame can be fixed to the metal shaped body by means of a connection that can be automatically produced—for example by means of a screw connection or a snap-action connection. This fosters automated mounting of the wall element and of the frame.

The current-carrying elements of the power semiconductor circuit can be electrically insulated from the inner side of that wall element at which the power semiconductor circuit is arranged. This prevents formation of an undesirable current path between the power semiconductor circuit and another element of the power semiconductor system—for example the metal shaped body and/or the working medium.

The power semiconductor circuit can have a substrate equipped with power semiconductors as is well-known.

The metallic heat sink of the wall element can be embodied as a simple metal plate or as a metal plate having cooling ribs or cooling pins projecting perpendicularly or substantially perpendicularly to a main area of the metal area. The cooling ribs and/or the cooling pins can bring about an enlargement of a heat-dissipating area of the heat sink.

The line system can be filled with a fluid working medium. The working medium, the inner side of the wall element can be in contact with the working medium. Direct contact of the inner side of the wall element by the working medium results in very good dissipation of the waste heat generated by the power semiconductor circuit.

The power semiconductor system can have a plurality of first cavities as described above. The power semiconductor system can have a plurality of wall elements as described above. A plurality or all of the individual openings formed by the individual cavities at at least one surface of the metal shaped body can be closed off in a liquid- and/or gas-tight manner by a single wall element. It is nevertheless possible for individual ones of the individual openings in each case to be closed off in a fluid-tight manner by individual wall elements. The power semiconductor system can have a frame as described above that presses a plurality of wall elements—for example in the manner described above—against the metal shaped body.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The invention is described below on the basis of exemplary embodiments explained in greater detail with reference to the drawings, in which, like same reference numerals refer to like parts.

DETAILED DESCRIPTION OF THE PRESENTLY PREFERRED EMBODIMENTS

Figure 1:
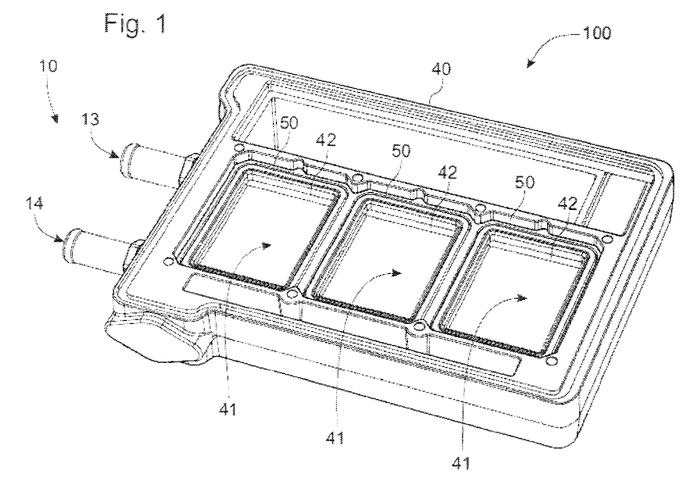
FIG. 1 is a perspective view of a metal shaped body for a power semiconductor system in accordance with a first embodiment of the invention.

FIG. 1 shows a perspective view of a metal shaped body 40 for a power semiconductor system 100 in accordance with a first embodiment of the invention. The metal shaped body is represented as a heat sink for a power semiconductor circuit, which heat sink can be cooled by a fluid working medium. Metal shaped body 40 has a plurality of approximately rectangular cavities 41 and a plurality of openings 42 therein. Inlet and outlet openings 13, 14 are provided for feeding in and discharging the working medium, respectively. The inlet opening is connected via the respective openings 42 to the respective cavities 41 of the metal shaped body 40 in such a way that the cavities 41, together with the inlet opening 13, form a line system 10 for the fluid working medium. The openings 43, via which—in a similar manner to the openings 42—the cavities 41 for the fluid working medium are connected to the outlet opening 14 are not shown in FIG. 1. Consequently, the working medium that flows into the inlet opening 13 flows via the openings 42 through the cavity 41 and subsequently to the outlet opening 14. A respective sealing element 50 is arranged around the respective cavity 41, said sealing element cooperating with a wall element 20 (not shown in FIG. 1) carrying a power semiconductor circuit 30 in order to close off the respective openings that form the respective cavities 41 in the upper area of the metal shaped body in a fluid-tight manner.

Figure 2:
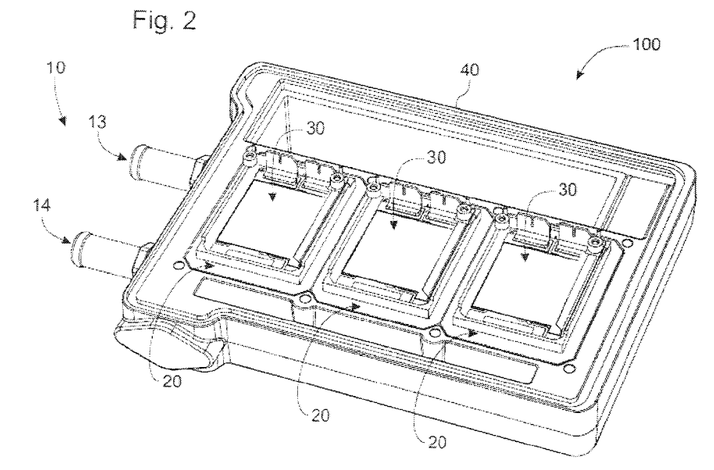
FIG. 2 is a perspective view of a power semiconductor system in accordance with a second embodiment of the invention.

FIG. 2 shows a perspective view of a power semiconductor system 100 in accordance with a second embodiment of the invention. The embodiment shown in FIG. 2 also has a metal shaped body 40 as shown in FIG. 1, having the features described above. Power semiconductor system 100 illustrated in FIG. 2 also has a plurality of wall elements 20. A power semiconductor circuit 30 is arranged at the outer side of respective wall element 20 facing away from metal shaped body 40. Each wall element 20 covers a respective cavity 41, which is not visible in the illustration in FIG. 2 owing to the covering by the respective wall element 20, as a result of which to close off the respective opening that forms the respectively covered cavity 41 in the upper area of the metal shaped body 40 in a fluid-tight manner. An inner side 22 (not visible in the illustration in FIG. 2) of the respective wall element 20 in this case forms a fluid-tight wall of line system 10. These inner sides 22 have direct contact with the fluid working medium flowing through line system 10, which provides very good cooling to wall elements 20 and, consequently, also of power semiconductor circuits 30 arranged at the outer side of wall elements 20.

Figure 3:
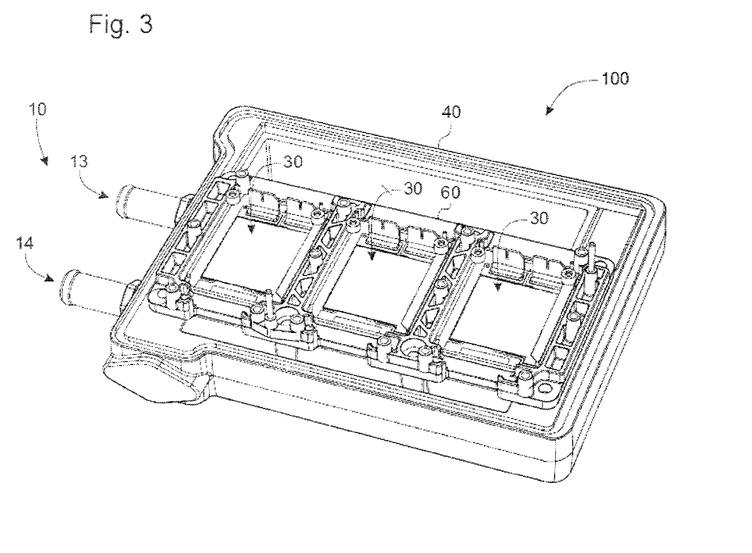
FIG. 3 is a perspective view of a power semiconductor system in accordance with a third embodiment of the invention.

FIG. 3 shows a perspective view of a power semiconductor system 100 in accordance with a third embodiment of the invention. The embodiment shown in FIG. 3 also has a power semiconductor system 100 as shown in FIG. 2, having the features described above. Power semiconductor system 100 illustrated in FIG. 3 additionally has a plastic frame 60, which is fixed to metal shaped body 40. Plastic frame 60 surrounds individual wall elements 20—not visible in FIG. 3—in such a way that the respective outer side of individual wall elements 20 is covered by plastic frame 60 only slightly—for example to the extent of less than about 10% or less than about 5%. At the same time, plastic frame 60 presses wall elements 20 against sealing elements 50 in the direction of metal shaped body 40, as a result of which wall elements 20 cooperate with sealing elements 50 in order to close off the openings formed by cavity 41 in the upper area of metal shaped body 40 in a fluid-tight manner. The use of an individual frame 60 simplifies mounting.

Figure 4:
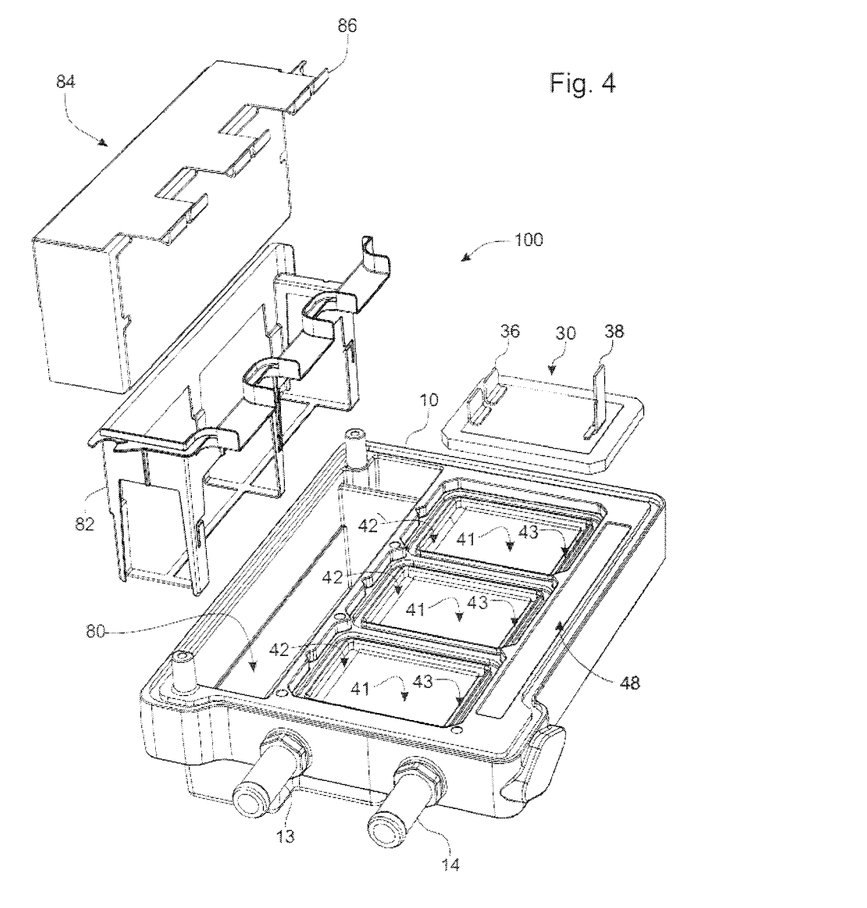
FIG. 4 illustrates a power semiconductor system in accordance with a fourth embodiment of the invention.

FIG. 4 shows a schematic exploded drawing of a power semiconductor system 100 in accordance with a fourth embodiment of the invention. By comparison with the embodiment of FIG. 1, here an additional capacitor module comprising an unhoused capacitor 84 and a spacer 82 produced from an electrically insulating material and serving for arranging the capacitor 84 in a depression 80 of the metal shaped body 40 is additionally provided. For electrically insulating capacitor 84 from metal shaped body 40, a potting compound (not illustrated) is additionally provided in depression 80.

As a result of this arrangement of capacitor 84 closely adjacent to the cavities 41 or the wall elements 20, capacitor 84 can be cooled simultaneously with the power circuits. The direct possibility of connecting capacitor 84 by connection elements 86 thereof to connection elements 36 of power circuit 30 that are assigned thereto is likewise discernible. In this case, it is preferred if the respective connection elements 36 are constructed and arranged with respect to one another in such a way that a welding connection can be formed. For this purpose, power semiconductor system 100 has a sufficient free space in order to be able to reach connection elements 36, 86 with a welding device.

It may also be preferred if connection elements 86 of capacitor 84 and the assigned connection elements 36 of power circuit 30 are not connected to one another permanently cohesively, but rather releasably, preferably in a force-locking manner.

Furthermore, and independently of the features described previously, it can be advantageous if, as illustrated here, metal shaped body 40 has a further cutout 48 in order to arrange there an external connecting element (not illustrated) and to connect the latter in each case and in a circuit-conforming manner to further connection elements 38 of power circuit 30. It is preferred if cutout 48 is provided laterally with respect to power circuits 40 or the assigned wall elements 20 opposite capacitor 84. Cutout 48 extends from that main side of metal shaped body 40 on which wall elements 20 are provided to the opposite main side.

Figure 5:
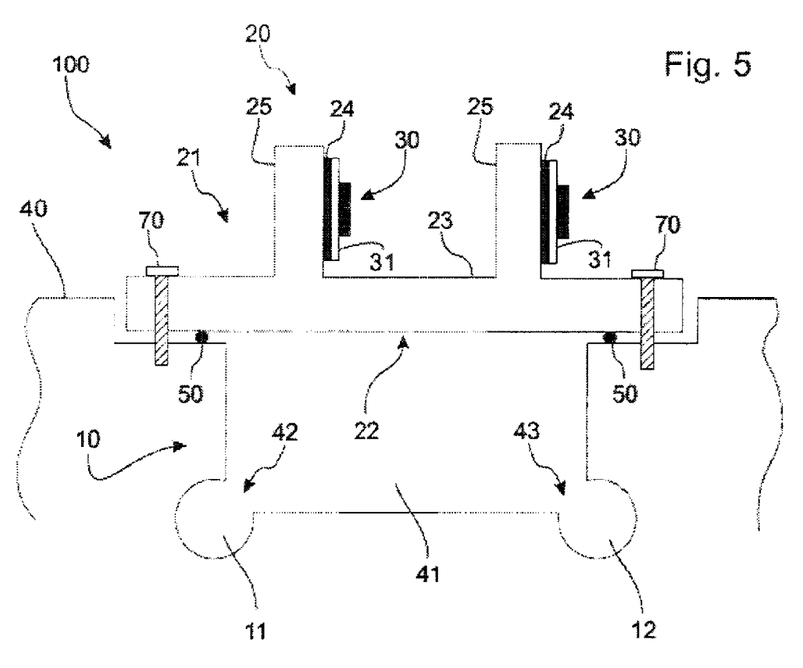
FIG. 5 is a schematic sectional illustration of a power semiconductor system in accordance with a fifth embodiment of the invention.

FIG. 5 shows a schematic sectional illustration of a power semiconductor system 100 in accordance with a fifth embodiment of the invention. Power semiconductor system 100 illustrated in FIG. 5 has a line system 10, a wall element 20, a plurality of power semiconductor circuits 30, a metal shaped body 40 and a sealing element 50.

Line system 10 is designed for carrying a fluid working medium serving as a cooling liquid and has an inlet-side section 11 and an outlet-side section 12, which are respectively connected to an inlet and outlet opening 13, 14 (not shown in FIG. 5).

Wall element 20 has an outer side 21 substantially facing away from line system 10 and an inner side 22 substantially facing line system 10. Wall element 20 has a metallic heat sink 23, which forms inner side 22 of wall element 20 in the embodiment illustrated here, and a plurality of substrates 31. Heat sink 23 has projections 25 that project perpendicularly from the main area of outer side 21 of wall element 20 and at which substrates 31 are arranged.

Each power semiconductor circuit 30 has a substrate 31 equipped with power semiconductors, said substrate having a ceramic plate 24 for electrically insulating substrate 31 from heat sink 23.

Metal shaped body 40 has a first cavity 41, which forms a part of line system 10. Cavity 41 can be formed by milling or molding metal shaped body 40. Cavity 41 has a first opening 42, through which the fluid working medium can flow between cavity 41 and inlet-side section 11, and a second opening 43, through which the fluid working medium can flow between cavity 41 and outlet-side section 12. The inlet- and outlet-side sections 11, 12 can be formed in a simple manner by respective holes in metal shaped body 40. First and second openings 42, 43 can be formed simply by the holes partly impinging on cavity 41.

Sealing element 50 is arranged between inner side 22 of wall element 20 and metal shaped body 40. The wall element is fixed to metal shaped body 40 by means of screws 70. The sealing element cooperates with inner side 22 of wall element 20 in a well-known technical manner in order to close off the opening formed by cavity 41 in the upper area of metal shaped body 40 in a fluid-tight manner. Consequently, inner side 22 of wall element 20 forms a wall of line system 10.

Figure 6:
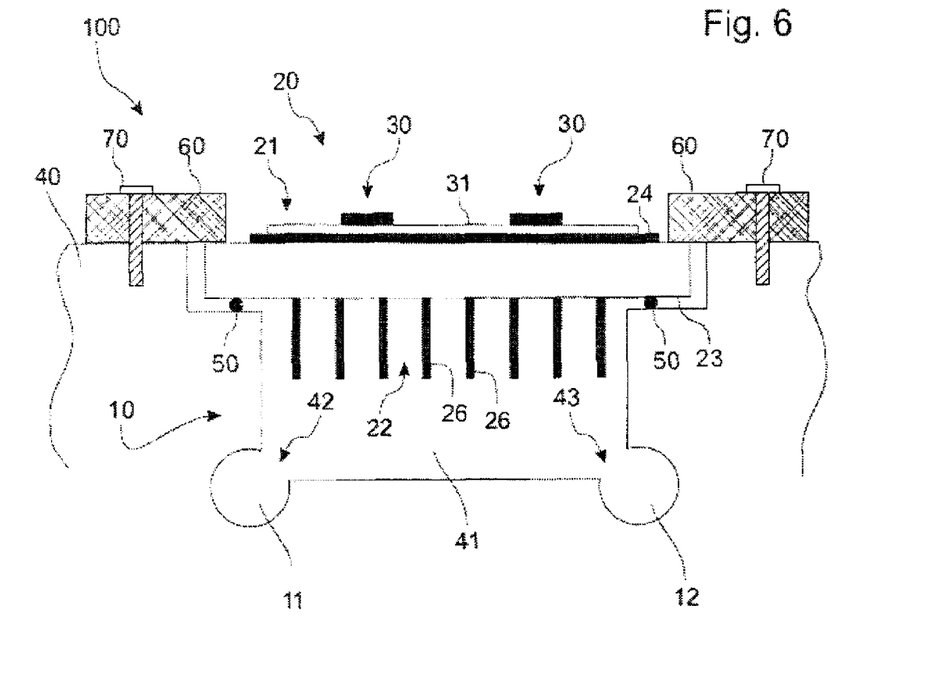
FIG. 6 is a schematic sectional illustration of a power semiconductor system in accordance with a sixth embodiment of the invention.

FIG. 6 shows a schematic sectional illustration of a power semiconductor system 100 in accordance with a sixth embodiment of the invention. Power semiconductor system 100 illustrated here has a line system 10, a wall element 20, a plurality of power semiconductor circuits 30, a metal shaped body 40, a sealing element 50 and a frame 60.

Line system 10 is designed for carrying a fluid working medium serving as a cooling liquid and has an inlet-side section 11 and an outlet-side section 12, which are respectively connected to an inlet and outlet opening 13, 14.

Wall element 20 has an outer side 21 substantially facing away from line system 10 and an inner side 22 substantially facing line system 10. The wall element 20 has a metallic heat sink 23, which forms inner side 22 of wall element 20 in the embodiment illustrated here. Heat sink 23 has pins 26 that project perpendicularly from the main area of inner side 22 of wall element 20 and which enlarge the heat-dissipating area of inner side 22 of wall element 20.

Each power semiconductor circuit 30 has a substrate 31 equipped with power semiconductors, substrate 31 having a ceramic plate 24 which provides electrical insulation from heat sink 23.

Metal shaped body 40 has a cavity 41, which forms a part of line system 10. This cavity 41 can be formed by metal shaped body 40 being correspondingly milled or produced in a corresponding casting mold. Cavity 41 has a first opening 42, through which the fluid working medium can flow between cavity 41 and inlet-side section 11, and a second opening 43, through which the fluid working medium can flow between cavity 41 and outlet-side section 12. The inlet- and outlet-side sections 11, 12 can be formed simply by respective holes in metal shaped body 40. First and second openings 42, 43 can be formed simply by the holes partly impinging on cavity 41.

Sealing element 50 is arranged between inner side 22 of wall element 20 and metal shaped body 40. The sealing element cooperates with inner side 22 of wall element 20 as is well-known to close off the opening formed by cavity 41 in the upper area of metal shaped body 40 in a fluid-tight manner. Consequently, inner side 22 of wall element 20 forms a wall of line system 10.

Frame 60, which can be produced from a non-conductive material and is fixed to metal shaped body 40 by screws 70, fixes wall element 20 to metal shaped body 40. In this case, frame 60 presses against outer side 21 of wall element 20 and bears against wall element 20 only in an outer edge region of outer side 21 of wall element 20.

It should explicitly be pointed out at this juncture that the embodiments illustrated in the figures can be modified in any manner described in this disclosure. It should additionally be pointed out at this juncture that all the features described above as seen by themselves and in any combination, in particular the details illustrated in the drawings, can be claimed as essential to the invention. Modifications thereof are familiar to the person skilled in the art.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A power semiconductor system, comprising:
   a line system for a fluid working medium;
   a metal shaped body;
   at least one wall element having an outer side and an inner side; and
   a power semiconductor circuit arranged at said outer side of said wall element;
   wherein said inner side of said wall element forms a fluid-tight wall of said line system;
   wherein a portion of said line system is formed by a plurality of first cavities in said metal shaped body; and
   wherein said metal shaped body has a depression for at least one capacitor which is arranged directly adjacent to said at least one wall element and which is cooled by said metal shaped body.

2. The power semiconductor system of claim 1,
   wherein at least one of said first cavities forms a part of said line system and an opening at a surface of said metal shaped body; and
   said wall element is mounted on said metal shaped body so that said inner side of said wall element closes off said opening in a fluid-tight manner.

3. The power semiconductor system of claim 2, further comprising:
   an elastic sealing element for closing off said inner side of said wall element with respect to said metal shaped body.

4. The power semiconductor system of claim 2, wherein said at least one of said first cavities has a first opening, which is connected to an inlet-side section of said line system, and a second opening, which is connected to an outlet-side section of said line system.

5. The power semiconductor system of claim 1, further comprising:
   a frame fixed to said metal shaped body, said frame fixing said wall element to said metal shaped body in one of a positively locking and a force-locking fashion.

6. The power semiconductor system of claim 1, wherein said power semiconductor circuit has current-carrying elements which are electrically insulated from said inner side of said wall element.

7. The power semiconductor system of claim 1, wherein said power semiconductor circuit includes a substrate equipped with power semiconductors.

8. The power semiconductor system of claim 1, wherein said wall element is a metallic heat sink.

9. The power semiconductor system of claim 8, wherein said metallic heat sink has ribs or pins for increasing a heat-dissipating area of said metallic heat sink.

10. The power semiconductor system of claim 1,
    wherein said line system is filled with a fluid working medium; and
    wherein said inner side of said wall element is in contact with said fluid working medium.

11. The power semiconductor system of Claim 1, wherein said capacitor is an unhoused capacitor and is arranged by means of a spacer and a potting agent in said depression.

* * * * *